US011605726B2

(12) United States Patent
Oh et al.

(10) Patent No.: US 11,605,726 B2
(45) Date of Patent: Mar. 14, 2023

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Hansu Oh, Shanghai (CN); Pengchong Li, Shanghai (CN); Xuejie Shi, Shanghai (CN); Yiyu Chen, Shanghai (CN); Bo Su, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 69 days.

(21) Appl. No.: 17/226,462

(22) Filed: Apr. 9, 2021

(65) Prior Publication Data
US 2022/0199808 A1 Jun. 23, 2022

(30) Foreign Application Priority Data
Dec. 18, 2020 (CN) .......................... 202011510689.4

(51) Int. Cl.
*H01L 29/76* (2006.01)
*H01L 29/94* (2006.01)
(Continued)

(52) U.S. Cl.
CPC ................. *H01L 29/66795* (2013.01); *H01L 21/823431* (2013.01); *H01L 21/823481* (2013.01); *H01L 29/7851* (2013.01)

(58) Field of Classification Search
CPC ....... H01L 29/66795; H01L 21/823431; H01L 21/823481; H01L 29/7851; H01L 29/7848;
(Continued)

(56) References Cited

U.S. PATENT DOCUMENTS

11,355,499 B2 * 6/2022 Hsu ................. H01L 21/823892
11,404,560 B2 * 8/2022 Basker ................. H01L 29/785

\* cited by examiner

Primary Examiner — Theresa T Doan
(74) Attorney, Agent, or Firm — Crowell & Moring, L.L.P.

(57) ABSTRACT

A semiconductor structure and a method for forming the same are provided. In one form, a forming method includes: providing a base, a gate structure, a source-drain doping region, and an interlayer dielectric layer; removing the gate structure located in an isolation region to form an isolation opening and expose the top and side walls of a fin located in the isolation region; performing first ion-doping on the fin under the isolation opening to form an isolation doped region, a doping type of the isolation doped region being different from a doping type of the source-drain doping region; and filling the isolation opening with an isolation structure after the doping, the isolation structure straddling the fin of the isolation region. In embodiments and implementations of the present disclosure, the isolation doped region is formed, a doping concentration of inversion ions in the fin of the isolation region can thus be increased, and a barrier of a P-N junction formed by the source-drain doping region and the fin of the isolation region can be increased accordingly, to prevent the device from generating a conduction current in the fin of the isolation region during
(Continued)

operation, thereby implementing isolation between the fin of the isolation region and the fin of other regions. Moreover, there is no need to perform a fin cut process. Hence the fin is made into a continuous structure, which helps prevent stress relief in the fin.

14 Claims, 4 Drawing Sheets (51) Int. Cl.
*H01L 29/66* (2006.01)
*H01L 21/8234* (2006.01)
*H01L 29/78* (2006.01)

(58) Field of Classification Search
CPC ..... H01L 21/823437; H01L 21/823493; H01L 27/0886; H01L 21/823412
USPC .......................................................... 257/288
See application file for complete search history.

SEMICONDUCTOR STRUCTURE AND METHOD FOR FORMING THE SAME

RELATED APPLICATIONS

The present application claims priority to Chinese Patent Appln. No. 202011510689.4, filed Dec. 18, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

In semiconductor manufacturing, with the development of very-large-scale integrated circuits, a feature size of integrated circuits is continuously decreasing. To adapt to a smaller feature size, a channel length of a metal-oxide-semiconductor field-effect transistor (MOSFET) is also reduced. However, as a channel length of a device becomes smaller, a distance between a source and a drain of the device also correspondingly decreases. Therefore, a channel control capability of a gate structure deteriorates, and it is increasingly difficult to pinch off the channel by a gate voltage, resulting in a higher possibility of subthreshold leakage, that is, the so-called short-channel effect (SCE).

Therefore, in order to reduce impact of the short-channel effect, the semiconductor process gradually transits from a planar MOSFET to a three-dimensional transistor with higher efficacy, such as a fin field-effect transistor (FinFET). In the FinFET, a gate structure may control an ultra-thin body (a fin) from at least two sides, and compared with the planar MOSFET, the gate structure has a stronger channel control capability, and can suppress the short-channel effects well. Moreover, compared with other devices, the FinFET has better compatibility with manufacturing of the existing integrated circuits.

However, current performance of the FinFET still needs to be improved.

SUMMARY

To address the problems described above, the present disclosure provides a semiconductor structure and a method for forming the same, to enhance performance of FinFET.

To address the foregoing problem, the present disclosure provides a method for forming a semiconductor structure. In one form, a method for forming a semiconductor structure includes: providing a base, including an isolation region corresponding to a fin cut position; where the base includes a substrate and a fin protruding from the substrate, a gate structure straddling the fin is formed on the substrate, a source-drain doping region is formed in the fin on both sides of the gate structure, an interlayer dielectric layer covering side walls of the gate structure and the source-drain doping region is formed on the substrate; removing the gate structure located in the isolation region to form an isolation opening and expose the top and side walls of the fin located in the isolation region; performing first ion-doping on the fin under the isolation opening to form an isolation doped region in the fin, a doping type of the isolation doped region being different from a doping type of the source-drain doping region; and filling the isolation opening with an isolation structure after the doping, the isolation structure straddling the fin of the isolation region.

In some implementations, the source-drain doping region is N-type doped, and the fin under the isolation opening is doped with P-type ions, the P-type ions including boron ions, gallium ions or indium ions; or the source-drain doping region is P-type doped, and the fin under the isolation opening is doped with N-type ions, the N-type ions including phosphorus ions, arsenic ions, or antimony ions.

In some implementations, the first ion-doping is performed on the fin under the isolation opening using an ion implantation process.

In some implementations, the source-drain doping region is N-type doped, ions in the ion implantation are boron ions, and parameters of the ion implantation process include: an implantation energy being 4 keV to 15 keV, an implantation dose being $2.0E14\ cm^{-2}$ to $1.0E15\ cm^{-2}$, and an implantation angle being 3° to 20°; or the source-drain doping region is P-type doped, ions that are implanted are phosphorus ions, and parameters of the ion implantation process include: an implantation energy being 4 keV to 15 keV, an implantation dose being $1.0E14\ cm^{-2}$ to $6.0E14\ cm^{-2}$, and an implantation angle being 10° to 20°.

In some implementations, the gate structure is a metal gate structure.

In some implementations, a process of removing the gate structure located in the isolation region includes a dry etching process.

In some implementations, in the step of providing the base, a gate dielectric layer is further formed between the fin and the gate structure; in the step of forming the isolation opening, the isolation opening exposes the gate dielectric layer located on the top and the side walls of the fin; and in the step of forming the isolation structure, the isolation structure is formed on the gate dielectric layer.

In some implementations, forming the isolation structure includes: filling the isolation opening with an isolation material layer, the isolation material layer being located on a top surface of the interlayer dielectric layer; and removing the isolation material layer located on the top surface of the interlayer dielectric layer, the remaining isolation material layer located in the isolation opening being used as the isolation structure.

In some implementations, a process of forming the isolation material layer includes one or more of a chemical vapor deposition process, an atomic layer deposition process, a flowable chemical vapor deposition process, a plasma enhanced chemical vapor deposition process, and a high aspect ratio process.

In some implementations, after the isolation structure is formed, the method for forming a semiconductor structure further includes: performing a thermal treatment on the isolation doped region.

In some implementations, a temperature of the thermal treatment is 450° C. to 650° C.

In some implementations, the thermal treatment includes: a rapid thermal annealing process, a dynamic surface annealing process, or a laser annealing process. In some implementations, the method for forming a semiconductor structure further includes: forming a source-drain opening penetrating the interlayer dielectric layer on the top of the source-drain doping region after the gate structure is formed and before the thermal treatment is performed on the isolation doped region, the source-drain opening exposing the source-drain doping region; performing second ion-doping on the source-drain doping region exposed by the source-drain opening, a doping type of the second ion-doping being the same as a doping type of the source-drain doping region; and forming a source-drain contact layer in the source-drain opening to be in contact with the source-drain doping region.

In some implementations, a process temperature of performing the first ion-doping on the fin under the isolation opening is 100° C. to 200° C.

The present disclosure further provides a semiconductor structure. In one form, a semiconductor structure includes: a base, including an isolation region corresponding to a fin cut position, the base including a substrate and a fin protruding from the substrate; a gate structure, located on the substrate and straddling the fin; an isolation structure, located on the substrate and penetrating the gate structure in the isolation region, the isolation structure straddling the fin of the isolation region and covering the top and side walls of the fin of the isolation region; a source-drain doping region, located in the fin on both sides of the gate structure and the isolation structure; an isolation doped region, located in the fin of the isolation region, a doping type of the isolation doped region being different from a doping type of the source-drain doping region; and an interlayer dielectric layer, located on the substrate, the interlayer dielectric layer covering side walls of the gate structure and the isolation structure, and the source-drain doping region.

In some implementations, the source-drain doping region is N-type doped, and doped ions in the isolation doped region are P-type ions, the P-type ions including boron ions, gallium ions or indium ions; or the source-drain doping region is P-type doped, and doped ions in the isolation doped region are N-type ions, the N-type ions including phosphorus ions, arsenic ions, or antimony ions.

In some implementations, the source-drain doping region is N-type doped, doped ions in the isolation doped region are boron ions, and a doping concentration of the boron ions in the isolation doped region is 3E18 cm$^{-3}$ to 3E20 cm$^{-3}$; or the source-drain doping region is P-type doped, doped ions in the isolation doped region are phosphorus ions, and a doping concentration of the phosphorus ions in the isolation doped region is 3E18 cm$^{-3}$ to 3E20 cm$^{-3}$.

In some implementations, a material of the isolation structure includes at least one of silicon oxide, silicon nitride, silicon oxynitride, silicon oxycarbide, silicon carbonitride, or silicon oxycarbonitride.

In some implementations, the gate structure is a metal gate structure.

In some implementations, the semiconductor structure further includes: a gate dielectric layer, located between the gate structure and the fin, and between the isolation structure and the fin.

Compared to the prior art, technical solutions of embodiments and implementations of the present disclosure have at least the following advantages.

According to forms of a method for forming a semiconductor structure provided in the present disclosure, the gate structure in the isolation region is removed to form an isolation opening, and first ion-doping is performed on the fin under the isolation opening to form an isolation doped region in the fin, a doping type of the isolation doped region being different from a doping type of the source-drain doping region. Therefore, a doping concentration of inversion ions in the fin of the isolation region can be increased, and a barrier of a P-N junction formed by the source-drain doping region and the fin of the isolation region can be increased accordingly, to prevent the device from generating a conduction current in the fin of the isolation region during operation, thereby implementing isolation between the fin of the isolation region and the fin of other regions through ion doping. Moreover, in embodiments and implementations of the present disclosure, there is no need to perform a fin cut process. Hence the fin is correspondingly made into a continuous structure, which helps prevent stress relief in the fin, thereby helping to improve carrier mobility of a channel. In summary, embodiments and implementations of the present disclosure help improve the performance of the FinFET.

Forms of a semiconductor structure of the present disclosure includes an isolation doped region, located in the fin of the isolation region, a doping type of the isolation doped region being different from a doping type of the source-drain doping region. Therefore, a doping concentration of inversion ions in the fin of the isolation region can be increased, and a barrier of a P-N junction formed by the source-drain doping region and the fin of the isolation region can be increased accordingly, to prevent the device from generating a conduction current in the fin of the isolation region during operation, thereby implementing isolation between the fin of the isolation region and the fin of other regions. Moreover, in embodiments and implementations of the present disclosure, isolation between the fin of the isolation region and the fin of other regions can be implemented without a fin cut process. Hence the fin is correspondingly made into a continuous structure, which helps prevent stress relief in the fin, thereby helping improve carrier mobility of a channel. In summary, embodiments and implementations of the present disclosure help improve the performance of the FinFET.

DETAILED DESCRIPTION

It can be known from the related art that a current performance of the FinFET still needs to be improved.

According to the analysis, taking a PMOS as an example, in a FinFET, SiGe is selected as the material of the fin, which can provide compressive stress to a channel of a PMOS device, thereby helping improve the carrier mobility.

During the formation of a semiconductor structure, a fin cut process is usually also included. After fin is formed, the fin at an unnecessary position is cut away by a fin cut process. However, the fin cut process often leads to stress relief in the fin, which in turn leads to a poor effect of improving the carrier mobility.

One method is to cut away fin at an unnecessary position after a dummy gate structure, a source-drain doping region in the fin on both sides of the dummy gate structure, and an interlayer dielectric layer are formed.

This approach can alleviate the problem of stress relief in the fin, but the fin cut process still leads to the stress relief in the fin, and the performance of FinFET needs to be improved.

To address the technical problems described above, the present disclosure provides a method for forming a semiconductor structure. In one form, a method for forming a semiconductor structure includes: providing a base, including an isolation region corresponding to a fin cut position; where the base includes a substrate and a fin protruding from the substrate, a gate structure straddling the fin is formed on the substrate, a source-drain doping region is formed in the fin on both sides of the gate structure, an interlayer dielectric layer covering side walls of the gate structure and the source-drain doping region is formed on the substrate; removing the gate structure located in the isolation region to form an isolation opening and expose the top and side walls of the fin located in the isolation region; performing first ion-doping on the fin under the isolation opening to form an isolation doped region in the fin, a doping type of the isolation doped region being different from a doping type of the source-drain doping region; and filling the isolation opening with an isolation structure after the doping, the isolation structure straddling the fin of the isolation region.

In forms of the method for forming a semiconductor structure of the present disclosure, the gate structure in the isolation region is removed to form an isolation opening, and first ion-doping is performed on the fin under the isolation opening to form an isolation doped region in the fin, a doping type of the isolation doped region being different from a doping type of the source-drain doping region. Therefore, a doping concentration of inversion ions in the fin of the isolation region can be increased, and a barrier of a P-N junction formed by the source-drain doping region and the fin of the isolation region can be increased accordingly, to prevent the device from generating a conduction current in the fin of the isolation region during operation, thereby implementing isolation between the fin of the isolation region and the fin of other regions through ion doping. Moreover, in forms of the present disclosure, there is no need to perform a fin cut process. Hence the fin is correspondingly made into a continuous structure, which helps prevent stress relief in the fin, thereby helping improve carrier mobility of a channel. In summary, embodiments and implementations of the present disclosure help improve the performance of the FinFET.

In order to make the foregoing objectives, features, and advantages of embodiments and implementations of the present disclosure more apparent and easier to understand, specific embodiments and implementations of the present disclosure are described in detail below with reference to the accompanying drawings.

FIG. 1 to FIG. 8 are schematic structural diagrams corresponding to steps in one form of a method for forming a semiconductor structure according to the present disclosure.

Figure 1:
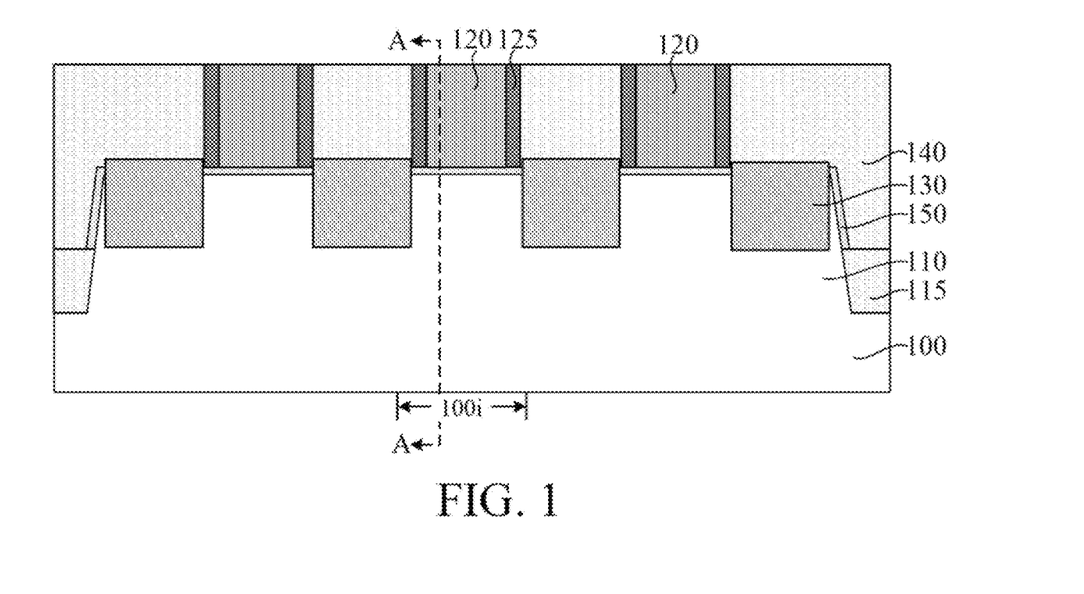
FIG. 1 to FIG. 8 are schematic structural diagrams corresponding to steps in one form of a method for forming a semiconductor structure according to the present disclosure.
Figure 2:
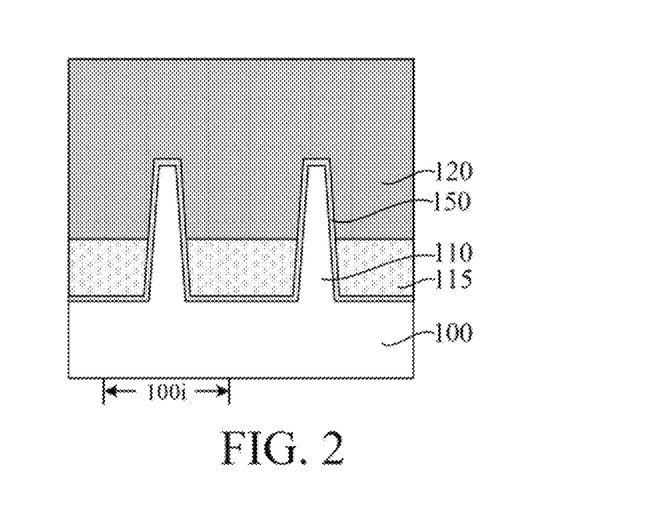

Referring to FIG. 1 and FIG. 2, FIG. 2 is a cross-sectional view of FIG. 1 along direction AA. A base is provided, the base including an isolation region 100i corresponding to a fin cut position; the base includes a substrate 100 and a fin 110 protruding from the substrate 100, a gate structure 120 straddling the fin 110 is formed on the substrate 100, a source-drain doping region 130 is formed in the fin 110 on both sides of the gate structure 120, and an interlayer dielectric layer 140 covering side walls of the gate structure 120 and the source-drain doping region 130 is formed on the substrate 100. The base is used to provide a process platform for a subsequent manufacturing procedure.

In this form, the base is used to perform a transistor, and the transistor may be one or both of an N-channel metal oxide semiconductor (NMOS) transistor or a P-channel metal oxide semiconductor (PMOS) transistor.

In this form, the base is used to perform a fin field-effect transistor, and the base includes a substrate 100 and a fin 110 protruding from the substrate 100.

In this form, the substrate 100 is a silicon substrate. In other forms, the substrate may alternatively be made of other materials such as germanium, silicon germanium, silicon carbide, gallium arsenide, or indium gallium, and the substrate may alternatively be other types of substrates such as a silicon substrate on an insulator or a germanium substrate on an insulator. The material of the substrate may be a material suitable for process requirements or easy to integrate.

The fin 110 is used to provide a conduction channel of a field-effect transistor.

In this form, isolation between the fin 110 of the isolation region 100i and the fin 110 of other regions does not need to be implemented by using a fin cut process. Hence the fin 110 is correspondingly made into a continuous structure, which helps prevent stress relief in the fin 110, thereby helping improve carrier mobility of a channel.

In this form, the fin 110 is made of the same material as the substrate 100, and the fin 110 is made of silicon. In other forms, the material of the fin may alternatively be a semiconductor material suitable for forming a fin, such as germanium, silicon germanide, silicon carbide, gallium arsenide or indium gallide.

The isolation region 100i corresponds to the fin cut position, and is used to define a position of the fin 110 that needs to be isolated.

It should be noted that an isolation layer 115 is formed on the substrate 100 exposed by the fin 110, and the isolation layer 115 covers a part of the side walls of the fin 110. The top surface of the isolation layer 115 is lower than the top surface of the fin 110.

The isolation layer 115 is used to isolate adjacent devices. In this form, a material of the isolation layer 115 is silicon oxide. In other forms, the material of the isolation layer may alternatively be other insulating materials such as silicon nitride or silicon oxynitride.

The gate structure 120 is used to control on/off of a conduction channel of a field-effect transistor.

In this form, the gate structure 120 is located on the isolation layer 115, straddles the fin 110, and covers a part of the top and a part of the side walls of the fin 110.

In this form, the gate structure 120 located in the isolation region 100i is used as a dummy gate, which needs to be removed later.

In this form, the gate structure 120 is a metal gate structure, and the gate structure 120 is formed by a high-k last, metal-gate last process. The gate structure 120 includes a work function layer (not shown) and a gate electrode layer (not shown) located on the work function layer.

The work function layer is used to adjust a work function of the gate structure 120, thereby adjusting a threshold voltage of the device. When a PMOS device is formed, the work function layer is a P-type work function layer, and a material of the P-type work function metal includes at least one of TiN, Ta, TaN, TaSiN or TiSiN; when an NMOS device is formed, the work function layer is an N-type work function layer, and a material of the N-type work function metal includes at lease one of TiAl, TaAlN, TiAlN, MoN, TaCN, or AlN. A material of the gate electrode layer is Al, Cu, Ag, Au, Pt, Ni, Ti, or W. In this form, the material of the gate electrode layer is W.

In other forms, the gate structure may alternatively be a polysilicon gate structure.

In this form, in the step of providing the base, a gate dielectric layer 150 is further formed between the fin 110 and the gate structure 120. The gate dielectric layer 150 is used to implement electrical isolation between the gate structure 120 and the fin 110.

The gate dielectric layer 150 is a gate oxide layer; or, the gate dielectric layer 150 is a high-k gate dielectric layer; or the gate dielectric layer 150 includes a gate oxide layer and a high-k gate dielectric layer located on the gate oxide layer.

A material of the gate oxide layer is silicon oxide or silicon oxynitride.

A material of the high-k gate dielectric layer is a high-k dielectric material, where the high-k dielectric material refers to a dielectric material having a relative dielectric constant greater than a relative dielectric constant of silicon oxide. Specifically, the material of the high-k gate dielectric layer is $HfO_2$. In other forms, the material of the high-k gate dielectric layer may alternatively be selected from $ZrO_2$, HfSiO, HfSiON, HfTaO, HfTiO, HfZrO, $Al_2O_3$, and the like.

In this form, spacers 125 are further formed on the side walls of the gate structure 120.

The spacers 125 are used to protect the side walls of the gate structure 120, and the spacers 125 are further used to define a region for forming the source-drain doping region 130.

The material of the spacer 125 may be at least one of silicon oxide, silicon nitride, silicon oxynitride, silicon carbide, silicon oxycarbonitride, silicon oxycarbide, boron nitride or boron oxycarbide. The spacer 125 may be a single-layer structure or a stacked structure. In this form, the spacer 125 is of a single-layer structure, and the material of the spacer 125 is silicon nitride.

The source-drain doping region 130 is used to provide a carrier source when the device is in operation. In this form, the source-drain doping region 130 is further used to provide stress for the channel, so as to improve the carrier mobility.

When an NMOS transistor is formed, the source-drain doping region 130 is N-type doped. The source-drain doping region 130 includes a stress layer doped with N-type ions, the material of the stress layer is Si or SiC, and the stress layer provides a compressive stress for a channel region of the NMOS transistor, which helps increase the carrier mobility of the NMOS transistor. The N-type ions are P ions, As ions, or Sb ions.

When a PMOS transistor is formed, the source-drain doping region 130 is P-type doped. The source-drain doping region 130 includes a stress layer doped with P-type ions, the material of the stress layer is Si or SiGe, and the stress layer provides a compressive stress for a channel region of the PMOS transistor, which helps increase the carrier mobility of the PMOS transistor. The P-type ions are B ions, Ga ions, or In ions.

The interlayer dielectric layer 140 is used to isolate adjacent devices. In this form, the interlayer dielectric layer 140 is located on the isolation layer 115 and covers side walls of the spacers 125.

The material of the interlayer dielectric layer 140 is an insulation material, for example, one or more of silicon oxide, silicon nitride, silicon oxynitride, silicon oxycarbide, silicon carbonitride, and silicon oxy-carbonitride. In this form, the interlayer dielectric layer 140 is of a single structure, and the material of the interlayer dielectric layer 140 is silicon oxide.

Figure 3:
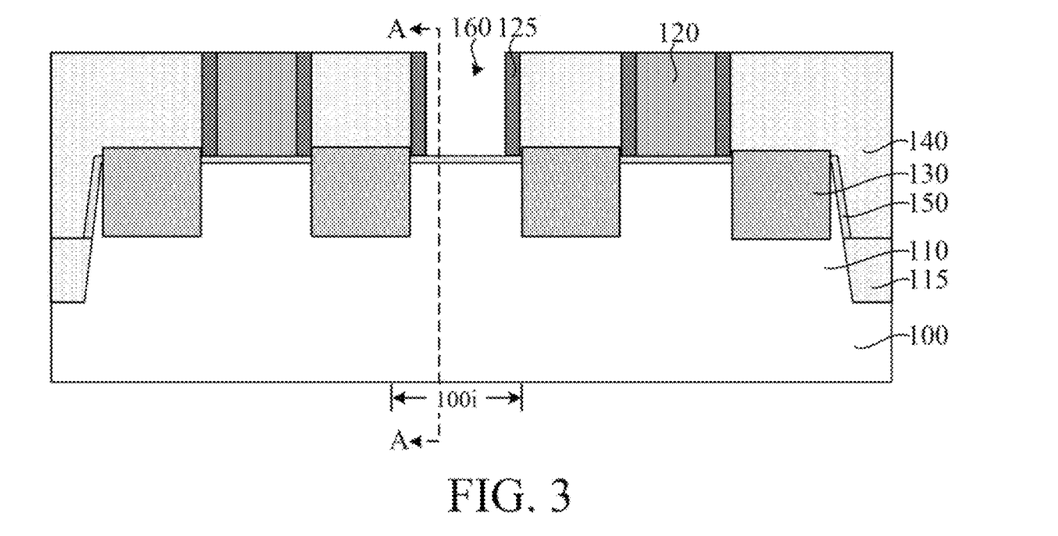
Figure 4:
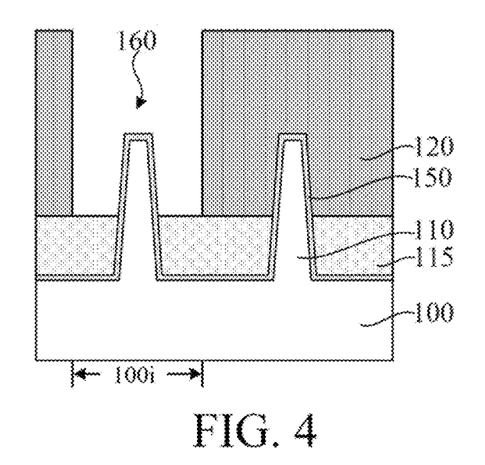

Referring to FIG. 3 and FIG. 4, FIG. 4 is a cross-sectional view of FIG. 3 along direction AA. The gate structure 120 located in the isolation region 100i is removed to form an isolation opening 160 and expose the top and side walls of the fin 110 located in the isolation region 100i.

The gate structure 120 located in the isolation region 100i is removed, and then the gate structure 120 is isolated in the isolation region 100i, so that the electrical performance of the device meets design requirements.

The gate structure 120 in the isolation region 100i is removed to form an isolation opening 160, and the isolation opening 160 exposes the top and side walls of the fin 110 in the isolation region 100i, so that the fin 110 exposed by the isolation opening 160 can be doped later.

It should be noted that the isolation opening 160 exposes the top and side walls of the fin 110 in the isolation region 100i, so that the gate structure 120 on the top and side walls of the fin 110 in the isolation region 100i is removed, thereby preventing a leakage current. Furthermore, compared with the isolation opening only exposing the top of the fin of the isolation region, the isolation opening exposing both the top and side walls of the fin in the isolation region helps increase the area of the exposed fin 110, which helps provide a larger process space for subsequent doping, thereby improving the isolation performance of the isolation doped region.

In this form, in the step of removing the gate structure 120 located in the isolation region 100i, the gate dielectric layer 150 located on the top and the side walls of the fin 110 is used as a stop layer to remove the gate structure 120 located in the isolation region 100i, which helps improve the uniformity of etching and reduce the difficulty of removing the gate structure 120 located in the isolation region 100i, and also helps reduce the damage to the fin 110.

Therefore, the isolation opening 160 exposes the gate dielectric layer 150 located on the top and the side walls of the fin 110, and the gate dielectric layer 150 can still protect the fin 110 in the subsequent step of doping the fin 110 under the isolation opening 160, thereby reducing the damage (for example, ion implantation damage) to the fin 110.

In this form, a process of removing the gate structure 120 in the isolation region 100i includes a dry etching process.

Figure 5:
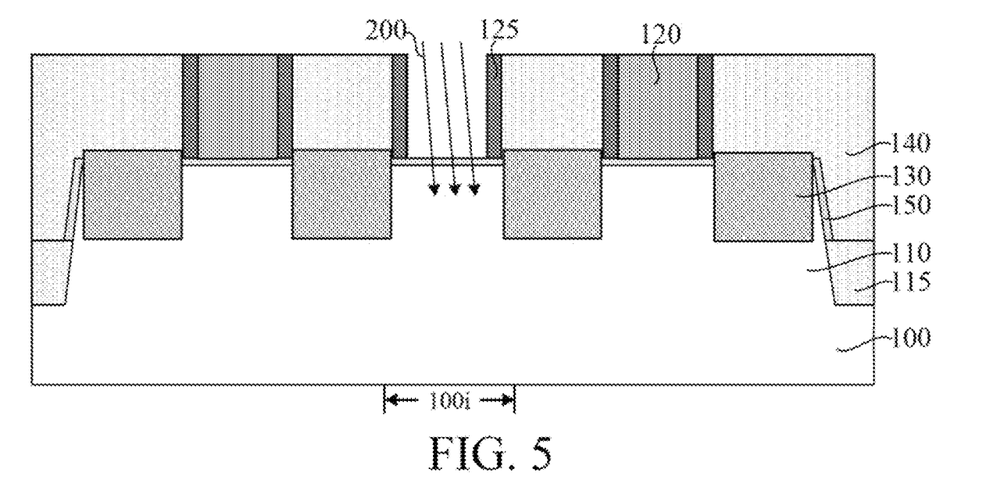
Figure 6:
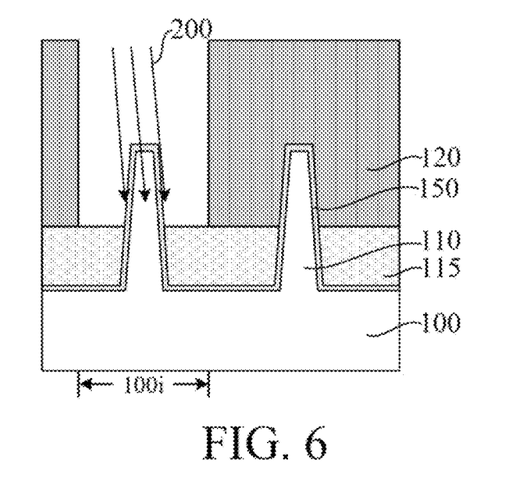

Referring to FIG. 5 and FIG. 6, FIG. 6 is a cross-sectional view of FIG. 5 at a position of the isolation opening 160 along a direction perpendicular to an extension direction of the fin 110. First ion-doping 200 is performed on the fin 110 under the isolation opening 160 to form an isolation doped region (not shown) in the fin 110, a doping type of the isolation doped region being different from a doping type of the source-drain doping region 130.

The first ion-doping 200 is performed on the fin 110 under the isolation opening 160 to form an isolation doped region in the fin 110, and a doping type of the isolation doped region is different from a doping type of the source-drain doping region 130. In this case, a doping concentration of inversion ions in the fin 110 of the isolation region 100i can be increased, and a barrier of a P-N junction formed by the source-drain doping region 130 and the fin 110 of the isolation region 100i can be increased accordingly, to prevent the device from generating a conduction current in the fin 110 of the isolation region 100i during operation, thereby implementing isolation between the fin 110 of the isolation region 100i and the fin 110 of other regions through ion doping. Moreover, in this form, there is no need to perform a fin cut process. Hence the fin 110 is correspondingly made into a continuous structure, which helps prevent stress relief in the fin 110, thereby helping improve carrier mobility of a channel. In summary, this form helps improve the performance of the FinFET.

In this form, the base is used to form a PMOS transistor, the source-drain doping region 130 is P-type doped, and the fin 110 under the isolation opening 160 is doped with N-type ions, the N-type ions including phosphorus ions, arsenic ions, or antimony ions.

In an example, the base is used to form a PMOS transistor, and the fin 110 under the isolation opening 160 is doped with phosphorus ions. The diffusion effect of the phosphorus ions is relatively good, which contributes to a graded doping concentration of the isolation doped region. Specifically, the diffusion effect of the phosphorus ions contributes to the graded doping concentration from the drain region in the source-drain doping region 130 to the substrate 100, thereby improving the band-to-band tunneling effect, and reducing a band-to-band tunneling current $I_b$.

In this form, the first ion-doping 200 is performed on the fin 110 under the isolation opening 160 by using an ion implantation process. In the ion implantation process, the implantation energy, the implantation dose, the implantation angle, and other parameters may be adjusted to make a doping profile and a doping concentration of the isolation doped region meet process requirements.

In this form, the base is used to form a PMOS transistor, the source-drain doping region 130 is P-type doped, ions in the ion implantation are phosphorus ions, and parameters of the ion implantation process include: an implantation energy being 4 keV to 15 keV, an implantation dose being 1.0E14 $cm^{-2}$ to 6.0E14 $cm^{-2}$, and an implantation angle being 10° to 20°.

The implantation energy should not be excessively high or excessively low. An excessively low implantation energy easily leads to an excessively low implantation depth of ions, and the isolation effect of the isolation doped region is likely to be reduced. An excessively high implantation energy easily leads to an excessively high implantation depth of the ions, which causes the ion doping concentration in the fin 110 of the isolation region 100$i$ to be excessively low, and the isolation performance of the isolation doped region is likely to be reduced. In view of this, in this form, the base is used to form a PMOS transistor, the source-drain doping region 130 is P-type doped, ions that are implanted are phosphorus ions, and an implantation energy of the ion implantation process is 4 keV to 15 keV.

The implantation dose should not be excessively high or excessively low. An excessively low implantation dose easily leads to an excessively low ion doping concentration in the isolation doped region, and the isolation effect of the isolation doped region is likely to be reduced. An excessively high implantation dose is likely to cause carriers in the isolation doped region and the source in the source-drain doping region 130 to increase, which in turn leads to an enhanced band to band tunneling effect and an increased leakage current from the drain to the substrate 100. In view of this, in this form, the base is used to form a PMOS transistor, the source-drain doping region 130 is P-type doped, ions in the implantation are phosphorus ions, and an implantation dose of the ion implantation process is 1.0E14 $cm^{-2}$ to 6.0E14 $cm^{-2}$. The implantation dose is set to 1.0E14 $cm^{-2}$ to 6.0E14 $cm^{-2}$, so that the ion doping concentration of the isolation doped region makes the band-to-band tunneling current $I_b$ and a source-drain punch-through current $I_s$ both relatively low, which correspondingly reduces the leakage current, thereby improving the isolation effect of the isolation doped region.

The implantation angle of the ion implantation process should not be excessively large. Otherwise, the implanted ions are likely to be blocked by the interlayer dielectric layer 140 or the gate structure 120 on the side walls of the isolation opening 160, resulting in an excessively small dose of ions implanted into the fin 110 under the isolation opening 160, and making it difficult for the doping concentration and doping depth of the isolation doped region to meet design requirements. In view of this, in this form, ions in the implantation are phosphorus ions, and an implantation angle of the ion implantation process is 10° to 20°.

In this form, the implantation angle refers to an included angle between an implantation direction and a surface normal of the substrate 100.

Similarly, in other forms, when the base is used to form an NMOS transistor, the source-drain doping region is N-type doped. Correspondingly, the fin under the isolation opening is doped with P-type ions, the P-type ions including boron ions, gallium ions or indium ions. For example, when the base is used to form an NMOS transistor, ions in the ion implantation are boron ions, and parameters of the ion implantation process include: an implantation energy being 4 keV to 15 keV, an implantation dose being 2.0E14 $cm^{-2}$ to 1.0E15 $cm^{-2}$, and an implantation angle being 3° to 20°.

In this form, a process temperature of performing the first ion-doping 200 on the fin 110 under the isolation opening 160 is higher than room temperature. By performing the first ion-doping at a process temperature higher than room temperature, ion hot implantation can be performed in this form, helping increase ion migration, which in turn helps ions to move back to a crystal lattice and correspondingly helps reduce the damage to the fin 110.

In this form, a process temperature of performing the first ion-doping 200 on the fin 110 under the isolation opening 160 is 100° C. to 200° C. Setting the process temperature of the first ion-doping 200 to 100° C. to 200° C. helps reduce the damage to the fin 110, and also helps improve process compatibility and reduce the thermal budget.

Figure 7:
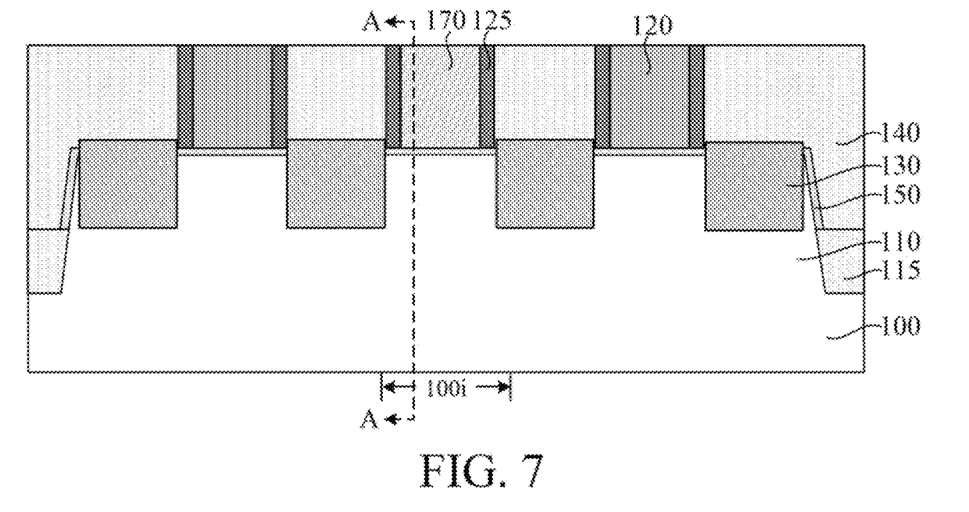
Figure 8:
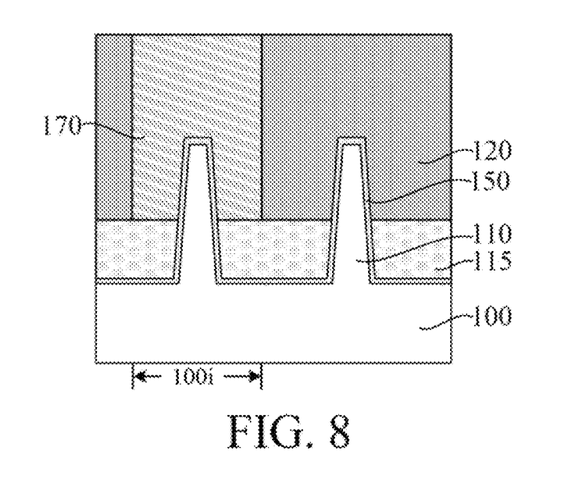

Referring to FIG. 7 to FIG. 8, FIG. 8 is a cross-sectional view of FIG. 7 along direction AA. After the first ion-doping 200 is performed, an isolation structure 170 is filled in the isolation opening 160, and the isolation structure 170 straddles the fin 110 of the isolation region 100$i$.

The isolation structure 170 is used to isolate the adjacent gate structures 120.

Therefore, a material of the isolation structure 170 is a dielectric material, the material of the isolation structure 170 including at least one of silicon oxide, silicon nitride, silicon oxynitride, silicon oxycarbide, silicon carbonitride, or silicon oxycarbonitride. In this form, the material of the isolation structure 170 is silicon oxide.

In this form, the isolation structure 170 is formed on the gate dielectric layer 150.

In this form, steps of forming the isolation structure 170 include: filling the isolation opening 160 with an isolation material layer (not shown), the isolation material layer being located on a top surface of the interlayer dielectric layer 140; and removing the isolation material layer located on the top surface of the interlayer dielectric layer 140, the remaining isolation material layer located in the isolation opening 160 being used as the isolation structure 170.

In this form, a process of forming the isolation material layer includes at least one of a chemical vapor deposition process, an atomic layer deposition process, a flowable chemical vapor deposition process, a plasma enhanced chemical vapor deposition process, and a high aspect ratio process. In an example, the flowable chemical vapor deposition (FCVD) process is used to form an isolation material layer. The FCVD process has high fluidity and is suitable for filling a gap having a high aspect ratio, which helps improve the filling quality of the isolation material layer in the isolation opening 160 and reduce defects generated in the isolation material layer.

In this form, a planarization process is used to remove the isolation material layer on the top surface of the interlayer dielectric layer 140. Specifically, the planarization process may be a chemical mechanical planarization (CMP) process. The CMP process is a global planarization technology, which helps improve the flatness of the top surface of the isolation structure 170, and improve height consistency between the top surface of the isolation structure 170 and that of the interlayer dielectric layer 140. In addition, the planarization efficiency of the CMP process is high.

In this form, after the isolation structure 170 is formed, the method for forming a semiconductor structure further includes: performing a thermal treatment on the isolation doped region.

The thermal treatment is used to activate doped ions in the isolation doped region.

The temperature of the thermal treatment should not be excessively low or excessively high. An excessively low temperature of the thermal treatment is likely to reduce the activation effect of the doped ions in the isolation doped region. An excessively high temperature of the thermal treatment is likely to damage the structure of the device, and also likely to damage the doping profile of the doped region that has been formed in the semiconductor structure. In view of this, in this form, the temperature of the thermal treatment is 450° C. to 650° C.

In this form, the thermal treatment includes a rapid thermal annealing (RTA) process, a dynamic surface annealing (DSA) process, or a laser annealing process.

It should be noted that, in this form, the method for forming a semiconductor structure further includes: forming a source-drain opening (not shown) penetrating the interlayer dielectric layer 140 on the top of the source-drain doping region 130 after the gate structure 120 is formed and before the thermal treatment is performed on the isolation doped region, the source-drain opening exposing the source-drain doping region 130; and performing second ion-doping on the source-drain doping region 130 exposed by the source-drain opening, a doping type of the second ion-doping being the same as a doping type of the source-drain doping region 130.

In this form, second ion-doping is performed on the source-drain doping region 130 exposed by the source-drain opening, and a doping type of the second ion-doping is the same as a doping type of the source-drain doping region 130, which helps increase the ion doping concentration in the source-drain doping region 130, thereby helping reduce the surface resistance of the source-drain doping region 130. In addition, after the source-drain contact layer in contact with the source-drain doping region 130 is subsequently formed in the source-drain opening, the contact resistance between the source-drain contact layer and the source-drain doping region 130 can be reduced.

Correspondingly, in this form, in the step of performing the thermal treatment, the thermal treatment can also activate doped ions in the source-drain doping region 130 through the second ion-doping, thereby integrating the solution of this embodiment with the process steps of the prior art. This helps improve process integration and process compatibility without an additional thermal treatment, and also helps reduce process costs.

Correspondingly, after the thermal treatment is performed, the method for forming a semiconductor structure further includes: forming a source-drain contact layer (not shown) in the source-drain opening to be in contact with the source-drain doping region 130.

The source-drain contact layer is used to implement an electrical connection between the source-drain doping region 130 and an external circuit or another interconnect structure. The source-drain contact layer is made of a conductive material, for example, W, Al, Cu, Ag, or Au.

Correspondingly, the present disclosure further provides a semiconductor structure. Referring to FIG. 7 and FIG. 8, FIG. 8 is a cross-sectional view of FIG. 7 along direction AA, and shows a schematic structural diagram of a semiconductor structure according to an embodiment of the present disclosure.

The semiconductor structure includes: a base, including an isolation region 100i corresponding to a fin cut position, the base including a substrate 100 and a fin 110 protruding from the substrate 100; a gate structure 120, located on the substrate 100 and straddling the fin 110; an isolation structure 170, located on the substrate 100 and penetrating the gate structure 120 in the isolation region 100i, the isolation structure 170 straddling the fin 110 of the isolation region 100i and covering the top and side walls of the fin 110 of the isolation region 100i; a source-drain doping region 130, located in the fin 110 on both sides of the gate structure 120 and the isolation structure 170; an isolation doped region (not shown), located in the fin 110 of the isolation region 100i, a doping type of the isolation doped region being different from a doping type of the source-drain doping region 130; and an interlayer dielectric layer 140, located on the substrate 100, the interlayer dielectric layer 140 covering side walls of the gate structure 120 and the isolation structure 170, and the source-drain doping region 130.

The isolation doped region is located in the fin 110 of the isolation region 100i, and a doping type of the isolation doped region is different from a doping type of the source-drain doping region 130. In this case, a doping concentration of inversion ions in the fin 110 of the isolation region 100i can be increased, and a barrier of a P-N junction formed by the source-drain doping region 130 and the fin 110 of the isolation region 100i can be increased accordingly, to prevent the device from generating a conduction current in the fin 110 of the isolation region 100i during operation, thereby implementing isolation between the fin 110 of the isolation region 100i and the fin 110 of other regions. Moreover, in this form, isolation between the fin 110 of the isolation region 100i and the fin 110 of other regions can be implemented without a fin cut process. Hence the fin 110 is correspondingly made into a continuous structure, which helps prevent stress relief in the fin 110, thereby helping improve carrier mobility of a channel. In summary, this form helps improve the performance of the FinFET.

In this form, the base is used to form a transistor, and the transistor may be one or both of an N-channel metal oxide semiconductor (NMOS) transistor or a P-channel metal oxide semiconductor (PMOS) transistor.

In this form, the base is used to form a fin field-effect transistor, and the base includes a substrate 100 and a fin 110 protruding from the substrate 100.

In this form, the substrate 100 is a silicon substrate. In other forms, the substrate may alternatively be made of other materials such as germanium, silicon germanium, silicon carbide, gallium arsenide, or indium gallium, and the substrate may alternatively be other types of substrates such as a silicon substrate on an insulator or a germanium substrate on an insulator. The material of the substrate may be a material suitable for process requirements or easy to be integrated.

The fin 110 is used to provide a conduction channel of a field-effect transistor.

In this form, isolation between the fin 110 of the isolation region 100i and the fin 110 of other regions can be implemented without a fin cut process. Hence the fin 110 is correspondingly made into a continuous structure, which helps prevent stress relief in the fin 110, thereby helping improve carrier mobility of a channel.

In this form, a material of fin 110 is the same as that of the substrate 100, and the material of the fin 110 is silicon. In other forms, the material of the fin may alternatively be a semiconductor material suitable for forming a fin, such as germanium, silicon germanide, silicon carbide, gallium arsenide or indium gallide.

The isolation region 100i corresponds to the fin cut position, and is used to define a position of the fin 110 that needs to be isolated.

It should be noted that the semiconductor structure further includes: an isolation layer 115, located on the substrate 100 exposed by the fin 110 and covering a part of side walls of the fin 110.

The isolation layer 115 is used to isolate adjacent devices. In this form, a material of the isolation layer 115 is silicon oxide. In other forms, the material of the isolation layer may alternatively be silicon nitride, silicon oxynitride, or other insulating materials.

A doping type of the isolation doped region is different from a doping type of the source-drain doping region 130. In this case, a doping concentration of inversion ions in the fin 110 of the isolation region 100i can be increased, and a barrier of a P-N junction formed by the source-drain doping region 130 and the fin 110 of the isolation region 100i can be increased accordingly, to prevent the device from generating a conduction current in the fin 110 of the isolation region 100i during operation, thereby implementing isolation between the fin 110 of the isolation region 100i and the fin 110 of other regions.

In this form, the base is used to form a PMOS transistor, the source-drain doping region 130 is P-type doped, and doped ions in the isolation doped region are correspondingly N-type ions, the N-type ions including phosphorus ions, arsenic ions, or antimony ions.

In an example, the base is used to form a PMOS transistor, the source-drain doping region 130 is P-type doped, and doped ions in the isolation doped region are phosphorus ions. The diffusion effect of the phosphorus ions is relatively good, which contributes to a graded doping concentration of the isolation doped region. Specifically, the diffusion effect of the phosphorus ions contributes to the graded doping concentration from the drain region in the source-drain doping region 130 to the substrate 100, thereby improving the band-to-band tunneling effect, and reducing a band-to-band tunneling current $I_b$.

In this form, the source-drain doping region 130 is P-type doped, doped ions in the isolation doped region are phosphorus ions, and a doping concentration of the phosphorus ions in the isolation doped region is 3E18 cm$^{-3}$ to 3E20 cm$^{-3}$.

The ion doping concentration of the isolation doped region should not be excessively low or excessively high. An excessively low ion doping concentration in the isolation doped region is likely to reduce the isolation effect of the isolation doped region. An excessively high ion doping concentration in the isolation doped region is likely to cause carriers in the isolation doped region and the source in the source-drain doping region 130 to increase, which in turn leads to an enhanced band to band tunneling effect and an increased leakage current from the drain to the substrate 100. In view of this, in this form, the base is used to form a PMOS transistor, the source-drain doping region 130 is P-type doped, doped ions in the isolation doped region are phosphorus ions, and a doping concentration of the phosphorus ions in the isolation doped region is 3E18 cm$^{-3}$ to 3E20 cm$^{-3}$. The doping concentration of the phosphorus ions in the isolation doped region is set to 3E18 cm$^{-3}$ to 3E20 cm$^{-3}$, so that the band-to-band tunneling current $I_b$ and the source-drain punch-through current $I_s$ are both relatively low, which correspondingly reduces the leakage current, thereby improving the isolation effect of the isolation doped region.

In an example, the base is used to form a PMOS transistor, the source-drain doping region 130 is P-type doped, and the doping concentration of the phosphorus ions in the isolation doped region is 3E19 cm$^{-3}$.

In other forms, when the base is used to form an NMOS transistor, the source-drain doping region is N-type doped. Correspondingly, doped ions in the isolation doped region are P-type ions, the P-type ions including boron ions, gallium ions or indium ions. In an example, when the base is used to form an NMOS transistor, the source-drain doping region is N-type doped, doped ions in the isolation doped region are boron ions, and the doping concentration of the boron ions in the isolation doped region is 3E18 cm$^{-3}$ to 3E20 cm$^{-3}$. In this case, the band-to-band tunneling current $I_b$ and the source-drain punch-through current $I_s$ are both relatively low, which correspondingly reduces the leakage current, thereby improving the isolation effect of the isolation doped region.

The gate structure 120 is used to control on/off of a conduction channel of a field-effect transistor.

In this form, the gate structure 120 is located on the isolation layer 115, and covers a part of the top and a part of the side walls of the fin 110.

In this form, the gate structure 120 is a metal gate structure. The gate structure 120 is formed by a high-k last, metal-gate last process. The gate structure 120 includes a work function layer (not shown) and a gate electrode layer (not shown) located on the work function layer.

The work function layer is used to adjust a work function of the gate structure 120, thereby adjusting a threshold voltage of the device. When a PMOS device is formed, the work function layer is a P-type work function layer, and a material of the P-type work function metal includes one or more of TiN, Ta, TaN, TaSiN and TiSiN; when an NMOS device is formed, the work function layer is an N-type work function layer, and a material of the N-type work function metal includes one or more of TiAl, TaAlN, TiAlN, MoN, TaCN, and AlN.

The gate electrode layer serves as an electrode for leading out the electricity of the gate structure 120, so that the gate structure 120 is electrically connected to an external circuit or another interconnect structure. A material of the gate electrode layer is Al, Cu, Ag, Au, Pt, Ni, Ti, or W. In this form, the material of the gate electrode layer is W.

In other forms, the gate structure may alternatively be a polysilicon gate structure.

The isolation structure 170 penetrates the gate structure 120 in the isolation region 100i, so that the gate structure 120 is isolated at the position of the isolation region 100i, and the electrical performance of the device meets design requirements. The isolation structure 170 is used to isolate the adjacent gate structures 120 accordingly.

The isolation structure 170 straddles the fin 110 of the isolation region 100i and covers the top and the side walls of the fin 110 of the isolation region 100i, so as to ensure the isolation effect of the isolation structure 170 for the adjacent gate structures 120, and prevent a leakage current.

Therefore, a material of the isolation structure 170 is a dielectric material, the material of the isolation structure 170 including at least one of silicon oxide, silicon nitride, silicon oxynitride, silicon oxycarbide, silicon carbonitride, or silicon oxycarbonitride. In this form, the material of the isolation structure 170 is silicon nitride.

In this form, the semiconductor structure further includes: a gate dielectric layer 150, located between the gate structure 120 and the fin 110, and between the isolation structure 170 and the fin 110.

The gate dielectric layer 150 is used to implement electrical isolation between the gate structure 120 and the fin 110.

In this form, the gate dielectric layer 150 is also used as a stop layer in the step of removing the gate structure 120 located in the isolation region 100i, which helps improve the uniformity of etching and reduce the difficulty of removing the gate structure 120 located in the isolation region 100i, and also helps reduce the damage to the fin 110. In addition, the isolation doped region is formed by doping the fin 110 of the isolation region 100i, and the gate dielectric layer 150 can also protect the fin 110 in the step of doping the fin 110 of the isolation region 100i, thereby reducing the damage (for example, ion implantation damage) to the fin 110.

The gate dielectric layer 150 is a gate oxide layer; or, the gate dielectric layer 150 is a high-k gate dielectric layer; or the gate dielectric layer 150 includes a gate oxide layer and a high-k gate dielectric layer located on the gate oxide layer.

A material of the gate oxide layer is silicon oxide or silicon oxynitride.

A material of the high-k gate dielectric layer is a high-k dielectric material, where the high-k dielectric material refers to a dielectric material having a relative dielectric constant greater than a relative dielectric constant of silicon oxide. Specifically, the material of the high-k gate dielectric layer is $HfO_2$. In other forms, the material of the high-k gate dielectric layer may alternatively be selected from $ZrO_2$, HfSiO, HfSiON, HfTaO, HfTiO, HfZrO, $Al_2O_3$, and the like.

In this form, the semiconductor structure further includes: spacers 125, located on side walls of the gate structure 120 and the isolation structure 170.

The spacers 125 are used to protect the side walls of the gate structure 120, and the spacers 125 are further used to define a region for forming the source-drain doping region 130.

The material of the spacer 125 may be at least one of silicon oxide, silicon nitride, silicon oxynitride, silicon carbide, silicon oxycarbonitride, silicon oxycarbide, boron nitride or boron oxycarbide. The spacer 125 may be a single-layer structure or a stacked structure. In this form, the spacer 125 is of a single-layer structure, and the material of the spacer 125 is silicon nitride.

The source-drain doping region 130 is used to provide a carrier source when the device is in operation. In this form, the source-drain doping region 130 is further used to provide stress for the channel, so as to improve the carrier mobility.

When an NMOS transistor is formed, the source-drain doping region 130 is N-type doped. The source-drain doping region 130 includes a stress layer doped with N-type ions, the material of the stress layer is Si or SiC, and the stress layer provides a compressive stress for a channel region of the NMOS transistor, which helps increase the carrier mobility of the NMOS transistor. The N-type ions are P ions, As ions, or Sb ions.

When a PMOS transistor is formed, the source-drain doping region 130 is P-type doped. The source-drain doping region 130 includes a stress layer doped with P-type ions, the material of the stress layer is Si or SiGe, and the stress layer provides a compressive stress for a channel region of the PMOS transistor, which helps increase the carrier mobility of the PMOS transistor. The P-type ions are B ions, Ga ions, or In ions.

The interlayer dielectric layer 140 is used to isolate adjacent devices. In this form, the interlayer dielectric layer 140 is located on the isolation layer 115 and covers side walls of the spacers 125.

The material of the interlayer dielectric layer 140 is an insulation material, for example, one or more of silicon oxide, silicon nitride, silicon oxynitride, silicon oxycarbide, silicon carbonitride, and silicon oxy-carbonitride. In this form, the interlayer dielectric layer 140 is of a single structure, and the material of the interlayer dielectric layer 140 is silicon oxide.

The semiconductor structure may be formed using the forming method described in the foregoing implementations, or may be formed by using other forming methods. For detailed descriptions of the semiconductor structure in this form, reference may be made to corresponding descriptions in the foregoing forms as details are not described herein again.

Although forms of the present disclosure are described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A method for forming a semiconductor structure, comprising:
   providing a base, comprising:
      an isolation region corresponding to a fin cut position,
      a substrate,
      a fin protruding from the substrate,
      a gate structure straddling the fin that is formed on the substrate,
      a source-drain doping region that is formed in the fin on both sides of the gate structure, and
      an interlayer dielectric layer covering side walls of the gate structure and the source-drain doping region is formed on the substrate;
   removing the gate structure located in the isolation region to form an isolation opening and expose the top and side walls of the fin located in the isolation region;
   performing first ion-doping on the fin under the isolation opening to form an isolation doped region in the fin, a doping type of the isolation doped region being different from a doping type of the source-drain doping region; and
   filling the isolation opening with an isolation structure after the first ion-doping is performed, the isolation structure straddling the fin of the isolation region.

2. The method for forming a semiconductor structure according to claim 1, wherein:
   the source-drain doping region is N-type doped, and the fin under the isolation opening is doped with P-type ions, where the P-type ions comprises boron ions, gallium ions or indium ions; or
   the source-drain doping region is P-type doped, and the fin under the isolation opening is doped with N-type ions, where the N-type ions comprises phosphorus ions, arsenic ions, or antimony ions.

3. The method for forming a semiconductor structure according to claim 1, further comprising: performing the first ion-doping on the fin under the isolation opening using an ion implantation process.

4. The method for forming a semiconductor structure according to claim 3, wherein:

the source-drain doping region is N-type doped, ions in the ion implantation are boron ions, and parameters of the ion implantation process comprise: an implantation energy being 4 keV to 15 keV, an implantation dose being $2.0E14$ $cm^{-2}$ to $1.0E15$ $cm^{-2}$, and an implantation angle being 3° to 20°; or the source-drain doping region is P-type doped, ions that are implanted are phosphorus ions, and parameters of the ion implantation process comprise: an implantation energy being 4 keV to 15 keV, an implantation dose being $1.0E14$ $cm^{-2}$ to $6.0E14$ $cm^{-2}$, and an implantation angle being 10° to 20°.

5. The method for forming a semiconductor structure according to claim 1, wherein the gate structure is a metal gate structure.

6. The method for forming a semiconductor structure according to claim 1, wherein a process of removing the gate structure located in the isolation region comprises a dry etching process.

7. The method for forming a semiconductor structure according to claim 6, wherein:

in the step of providing the base, a gate dielectric layer is further formed between the fin and the gate structure;

in the step of forming the isolation opening, the isolation opening exposes the gate dielectric layer located on the top and the side walls of the fin; and in the step of forming the isolation structure, the isolation structure is formed on the gate dielectric layer.

8. The method for forming a semiconductor structure according to claim 1, wherein steps of forming the isolation structure comprise:

filling the isolation opening with an isolation material layer, the isolation material layer being located on a top surface of the interlayer dielectric layer; and removing the isolation material layer located on the top surface of the interlayer dielectric layer, the remaining isolation material layer located in the isolation opening being used as the isolation structure.

9. The method for forming a semiconductor structure according to claim 8, wherein a process of forming the isolation material layer comprises at least one of a chemical vapor deposition process, an atomic layer deposition process, a flowable chemical vapor deposition process, a plasma enhanced chemical vapor deposition process, or a high aspect ratio process.

10. The method for forming a semiconductor structure according to claim 1, wherein after the isolation structure is formed, the method for forming a semiconductor structure further comprises: performing a thermal treatment on the isolation doped region.

11. The method for forming a semiconductor structure according to claim 10, wherein a temperature of the thermal treatment is 450° C. to 650° C.

12. The method for forming a semiconductor structure according to claim 10, wherein the thermal treatment comprises: a rapid thermal annealing process, a dynamic surface annealing process, or a laser annealing process.

13. The method for forming a semiconductor structure according to claim 10, wherein:

the method for forming a semiconductor structure further comprises:

forming a source-drain opening penetrating the interlayer dielectric layer on the top of the source-drain doping region after the gate structure is formed and before the thermal treatment is performed on the isolation doped region, the source-drain opening exposing the source-drain doping region; and performing second ion-doping on the source-drain doping region exposed by the source-drain opening, a doping type of the second ion-doping being the same as a doping type of the source-drain doping region; and after the thermal treatment is performed, the method for forming a semiconductor structure further comprises: forming a source-drain contact layer in the source-drain opening to be in contact with the source-drain doping region.

14. The method for forming a semiconductor structure according to claim 1, wherein a process temperature of performing the first ion-doping on the fin under the isolation opening is 100° C. to 200° C.

* * * * *